US010740524B1

(12) United States Patent
Koila

(10) Patent No.: US 10,740,524 B1
(45) Date of Patent: Aug. 11, 2020

(54) HIGH PERFORMANCE AND AREA EFFICIENT BOSE-CHAUDHURI-HOCQUENGHEM DECODER IMPLEMENTED IN FIELD PROGRAMMABLE GATE ARRAY

(71) Applicant: Smart IOPS, Inc., Milpitas, CA (US)

(72) Inventor: Shriharsha Koila, Karnataka (IN)

( * ) Notice: Subject to any disclaimer, the term of this patent is extended or adjusted under 35 U.S.C. 154(b) by 0 days.

(21) Appl. No.: 16/431,909

(22) Filed: Jun. 5, 2019

(51) Int. Cl.
*G06F 30/34* (2020.01)

(52) U.S. Cl.
CPC .................................. *G06F 30/34* (2020.01)

(58) Field of Classification Search
CPC .................................. G06F 30/34; G06F 30/30
See application file for complete search history.

(56) References Cited

U.S. PATENT DOCUMENTS

2015/0311920 A1* 10/2015 Wang ................ H03M 13/1545
714/764
2016/0359502 A1* 12/2016 Lin ..................... H03M 13/152

\* cited by examiner

*Primary Examiner* — Vuthe Siek
(74) *Attorney, Agent, or Firm* — Goldberg Segalla

(57) ABSTRACT

A decoder is implemented in a field programmable gate array (FPGA) by performing logic simplification of binary expressions associated with the decoder. To perform the logic simplification, the binary expressions are arranged in a binary matrix. Further, a set of submatrices is formed based on the binary expressions such that rows of each submatrix have common data bits in one or more columns of each submatrix. Based on the common data bits, a set of subexpressions for each submatrix is formed. The set of subexpressions of each submatrix is mapped into look-up table clusters of the FPGA, thereby implementing the decoder in the FPGA.

20 Claims, 9 Drawing Sheets

HIGH PERFORMANCE AND AREA EFFICIENT BOSE-CHAUDHURI-HOCQUENGHEM DECODER IMPLEMENTED IN FIELD PROGRAMMABLE GATE ARRAY

FIELD OF THE INVENTION

The present invention relates generally to electronic circuits, and more particularly, to high performance and area efficient decoder implemented in a field programmable gate array (FPGA).

BACKGROUND

A decoder is typically implemented in a receiver that receives data bits over a communication link from a transmitter. When the communication link is noisy, the reception of the data bits over the communication link usually results in errors. To identify and correct such errors, the data bits are typically encoded, before transmitting, using an error correcting code. One example of such error correcting code is a Bose-Chaudhuri-Hocquenghem (BCH) code that is defined over a finite field such as a Galois Field $GF(2^m)$, where 'm' is a positive integer. Upon receiving the encoded data bits, a BCH decoder decodes the encoded data bits to identify erroneous data bits. Further, the erroneous data bits are inverted to rectify the errors. The decoding of the encoded data bits includes determining syndrome vectors based on the reception of the encoded data bits, determining an error locator polynomial (ELP) based on the syndrome vectors, and solving the ELP to identify the erroneous data bits in the encoded data bits. A known method to solve the ELP is a brute force method that may be performed by a circuit that implements a Chien search algorithm.

FIG. 1 illustrates a block diagram of a conventional parallel Chien search circuit (PCSC) 100 of a conventional BCH decoder (not shown) that solves the ELP for identifying the erroneous data bits. The PCSC 100 includes a feedback circuit 102 and a substitution circuit 104. The feedback circuit 102 includes first through $t^{th}$ multiplexers 106a-106t, first through $t^{th}$ multipliers 108a-108t, first through $t^{th}$ registers 110a-110t, and a first adder 112. The first multiplexer 106a receives a first input $\lambda_1$ from a key equation solver (KES) circuit (not shown) which is external to the PCSC 100. The first input $\lambda_1$ is a first co-efficient of the ELP. The ELP is shown in equation (1) as:

$$\lambda(x) = 1 + \lambda_1 \cdot x^1 + \lambda_2 \cdot x^2 + \ldots + \lambda_t \cdot x^t \qquad (1)$$

where 't' is number of erroneous data bits that are correctable by the PCSC 100, and 'x' is a non-zero field element of the Galois Field $GF(2^m)$. Field elements of the Galois Field $GF(2^m)$, having a primitive element '$\alpha$' are $\{0\ \alpha^1 \alpha^2 \ldots \alpha^{(p-1)}\ \alpha^p\ \alpha^{(p+1)} \ldots \alpha((2^{\wedge}m)-1)\}$, where 'p' is number of data bits processed per cycle for solving the ELP. The conventional BCH decoder receives 'n' number of data bits such that '$n \leq (2^m - 1)$'. Therefore, $x = \{\alpha^1\ \alpha^2 \ldots \alpha^{(p-1)}\ \alpha^p\ \alpha^{(p+1)} \ldots \alpha^n\}$. Further, the field elements are constant for a BCH decoder and hence, are stored in a memory (not shown) associated with the PCSC 100.

The first multiplexer 106a is connected to the first register 110a for receiving a second input $f_1$. The first multiplexer 106a selects and outputs one of the first or second inputs $\lambda_1$ or $f_1$ based on a select line (not shown). Similarly, the second through $t^{th}$ multiplexers 106b-106t receive corresponding first inputs $\lambda_2$-$\lambda_t$ from the KES circuit, and corresponding second inputs $f_2$-$f_t$ from the second through $t^{th}$ registers 110b-110t, respectively. The second through $t^{th}$ multiplexers 106b-106t select and output one of the first inputs $\lambda_2$-$\lambda_t$ or second inputs $f_2$-$f_t$, respectively, based on the corresponding select lines.

The first multiplier 108a is connected to the first multiplexer 106a for receiving a third input $i_1$, i.e., an output ($\lambda_1$ or $f_1$) of the first multiplexer 106a. The first multiplier 108a is further connected to the memory for receiving a fourth input $\alpha^p$. The fourth input $\alpha^p$ is a field element of the Galois Field $GF(2^m)$. The first multiplier 108a multiplies the third and fourth inputs $i_1$ and $\alpha^p$, and generates a first multiplication output $x_1$. The first register 110a is connected to the first multiplier 108a for receiving the first multiplication output $x_1$. The first register 110a may be a D-latch that outputs the first multiplication output $x_1$ when the first register 110a is triggered by a clock signal (not shown). Similarly, the second through $t^{th}$ multipliers 108b-108t are connected to the second through $t^{th}$ multiplexers 106b-106t for receiving corresponding third inputs $i_2$-$i_t$, and the memory for receiving corresponding fourth inputs $\alpha^{(2*p)}$-$\alpha^{(t*p)}$. The second through $t^{th}$ multipliers 108b-108t multiply the corresponding third and fourth inputs $i_2$-$i_t$ and $\alpha^{(2*p)}$-$\alpha^{(t*p)}$, and generate second through $t^{th}$ multiplication outputs $x_2$-$x_t$, respectively. Further, the second through $t^{th}$ registers 110b-110t are connected to the second through $t^{th}$ multipliers 108b-108t for receiving the second through $t^{th}$ multiplication outputs $x_2$-$x_t$, respectively. Thus, the first through $t^{th}$ multipliers 108a-108t output a first set of multiplication outputs (i.e., first through $t^{th}$ multiplication outputs $x_1$-$x_t$).

The first adder 112 is connected to the first through $t^{th}$ multipliers 108a-108t for receiving the first through $t^{th}$ multiplication outputs $x_1$-$x_t$, respectively. The first adder 112 generates a first sum $Y_p$ based on a summation of the first through $t^{th}$ multiplication outputs $x_1$-$x_t$. The first sum $Y_p$ is shown in equation (2) as:

$$Y_p = i_1 \cdot \alpha^p + i_2 \cdot \alpha^{2*p} + \ldots + i_t \cdot \alpha^{t*p} \qquad (2)$$

when $i_1$-$i_t = \lambda_1$-$\lambda_t$, the first sum $Y_p$ is shown in equation (3) as:

$$Y_p = \lambda_1 \cdot \alpha^p + \lambda_2 \cdot \alpha^{2*p} + \ldots + \lambda_t \cdot \alpha^{t*p} \qquad (3)$$

From the equations (1) and (3), $Y_p = \lambda(x) - 1$, for $x = \alpha^p$. To solve the ELP for $x = \alpha^p$, '1' is added to the first sum $Y_p$ by an adder (not shown) which is external to the PCSC 100. If '$1 + Y_p = 0$', a presence of an error in a $p^{th}$ data bit is detected. To correct the error, a current value of the $p^{th}$ data bit is inverted.

The substitution circuit 104 includes multipliers 114_11-114_zt that are arranged in an arrangement as illustrated in FIG. 1. The arrangement includes first through $(p-1)^{th}$ rows and first through $t^{th}$ columns. The first row includes 't' number of multipliers [114_11 114_12 … 114_1t] arranged in the first through $t^{th}$ columns, respectively. Similarly, the second through $(p-1)^{th}$ rows include multipliers [114_21 114_22 … 114_2t] through [114_z1 114_z2 … 114_zt] arranged in the first through $t^{th}$ columns, respectively. Thus, the first column includes multipliers [114_11 114_21 … 114_z1]. Similarly, the second through $t^{th}$ columns include multipliers [114_12 114_22 … 114_z2] through [114_1t 114_2t … 114_zt], respectively. The substitution circuit 104 further includes second through $p^{th}$ adders 116a-116z.

The multipliers [114_11 114_21 … 114_z1] in the first column are connected to the first multiplexer 106a for receiving corresponding third inputs $i_1$. Similarly, the multipliers [114_11 114_21 … 114_z1] are connected to the memory for receiving corresponding fourth inputs $[\alpha\ \alpha^2 \ldots \alpha^{(p-1)}]$. For example, the multiplier 114_11 receives $i_1$ and 'α' as the corresponding third and fourth inputs. Similarly, the multipliers [114_12 114_22 . . . 114_z2] through [114_1t 114_2t . . . 114_zt] are connected to the second through $t^{th}$ multiplexers 106b-106t for receiving corresponding third inputs $i_2$-$i_t$, and the memory for receiving corresponding fourth inputs [$α^2$ $α^{*2}$ . . . $α^{2*(p-1)}$]-[$α^t$ $α^{t*2}$ . . . $α^{t*(p-1)}$]. The multipliers [114_11 114_12 . . . 114_1t] multiply the corresponding third and fourth inputs to generate a second set of multiplication outputs [$x_{11}$ $x_{12}$ . . . $x_{1t}$], respectively. Similarly, the multipliers [114_21 114_22 . . . 114_2t] through [114_z1 114_z2 . . . 114_zt] multiply the corresponding third and fourth inputs, and generate third through $p^{th}$ sets of multiplication outputs [$x_{21}$ $x_{22}$ . . . $x_{2t}$]-[$x_{z1}$ $x_{z2}$ . . . $x_{zt}$], respectively.

The second adder 116a is connected to the multipliers [114_11 114_12 . . . 114_1t] of the first row for receiving the second set of multiplication outputs [$x_{11}$ $x_{12}$ . . . $x_{1t}$]. The second adder 116a generates a second sum $Y_1$ based on a summation of the second set of multiplication outputs [$x_{11}$ $x_{12}$ . . . $x_{1t}$]. If '1+$Y_1$=0', a presence of an error in a first data bit is detected. To correct the error, a current value of the first data bit is inverted. Similarly, the third through $p^{th}$ adders 116b-116z are connected to the multipliers [114_21 114_22 . . . 114_2t] through [114_z1 114_z2 . . . 114_zt] for receiving the third through $p^{th}$ sets of multiplication outputs [$x_{21}$ $x_{22}$ . . . $x_2t$]-[$x_{z1}$ $x_{z2}$ . . . $x_{zt}$], respectively. The third through $p^{th}$ adders 116b-116z generate third through $p^{th}$ sums $Y_2$-$Y_{(p-1)}$ based on summations of the third through $p^{th}$ sets of multiplication outputs [$x_{21}$ $x_{22}$ . . . $x_{2t}$]-[$x_{z1}$ $x_{z2}$ . . . $x_{zt}$], respectively.

The PCSC 100 solves the ELP for the field elements of the Galois Field GF($2^m$) in first through $(n/p)^{th}$ cycles. In the first cycle, the first through $t^{th}$ multiplexers 106a-106t select and output the corresponding first inputs $λ_1$-$λ_t$, i.e., $i_1$-$i_t$=$λ_1$-$λ_t$. Thus, the first multiplier 108a and the multipliers [114_11 114_21 . . . 114_z1] receive $λ_1$ as the corresponding third inputs. Similarly, the second through $t^{th}$ multipliers 108b-108t and the multipliers [114_12 114_22 . . . 114_z2] through [114_1t 114_2t . . . 114_zt] receive $λ_2$-$λ_t$, respectively, as the corresponding third inputs. The first through $t^{th}$ multipliers 108a-108t and the multipliers [114_11 114_12 . . . 114_1t] through [114_z1 114_z2 . . . 114_zt] further receive $α^p$-$α^{(t*p)}$ and [$α^1$ $α^2$ . . . $α^t$]-[$α^{(p-1)}$ $α^{2*(p-1)}$ . . . $α^{t*(p-1)}$], respectively, as corresponding fourth inputs. Further, the first through $t^{th}$ multipliers 108a-108t and the multipliers 114_11-114_zt generate the first through $p^{th}$ sets of multiplication outputs based on the corresponding third and fourth inputs. The first adder 112 generates the first sum $Y_p$ based on the first set of multiplication outputs $x_1$-$x_t$. Similarly, the second through $p^{th}$ adders 116a-116z generate the second through $p^{th}$ sums $Y_1$-$Y_{(p-1)}$ based on the second through $p^{th}$ sets of multiplication outputs [$x_{11}$ $x_{12}$ . . . $x_{1t}$]-[$x_{z1}$ $x_{z2}$ . . . $x_{zt}$], respectively. The first sum $Y_p$ and the second through $p^{th}$ sums $Y_1$-$Y_{(p-1)}$ are individually added with '1' to determine which of the first through $p^{th}$ data bits are erroneous. The erroneous data bits are corrected by inverting current values of the erroneous data bits. Further, the first through $t^{th}$ registers 110a-110t store the first through $t^{th}$ multiplication outputs $x_1$-$x_t$, respectively.

In the second cycle, the first through $t^{th}$ multiplexers 106a-106t select and output the second inputs $f_1$-$f_t$, i.e., $i_1$-$i_t$=$λ_1·α^p$-$λ_t·α^{t*p}$), respectively. The second inputs $f_1$-$f_t$ are the first through $t^{th}$ multiplication outputs $x_1$-$x_t$ (i.e., $λ_1·α^p$-$λ_t·α^{t*p}$) of the first cycle, respectively. The first through $t^{th}$ multipliers 108a-108t and the multipliers [114_11 114_21 . . . 114_z1] through [114_1t 114_2t . . . 114_zt] receive $λ_1·α^p$-$λ_t·α^{t*p}$ as the corresponding third inputs, respectively. The first through $t^{th}$ multipliers 108a-108t and the multipliers [114_11 114_12 . . . 114_1t] through [114_z1 114_z2 . . . 114_zt] further receive $α^p$-$α^{(t*p)}$ and [$α_1$ $α^2$ . . . $α^t$]-[$α^{(p-1)}$ $α^{2*(p-1)}$ . . . $α^{t*(p-1)}$], respectively, as the corresponding fourth inputs. The first through $t^{th}$ multipliers 108a-108t and the multipliers 114_11-114_zt generate the first through $p^{th}$ sets of multiplication outputs based on the corresponding third and fourth inputs. The first adder 112 generates the first sum $Y_p$ based on the first set of multiplication outputs $x_1$-$x_t$. Similarly, the second through $p^{th}$ adders 116a-116z generate the second through $p^{th}$ sums $Y_1$-$Y_{(p-1)}$ based on the second through $p^{th}$ sets of multiplication outputs [$x_{11}$ $x_{12}$ . . . $x_{1t}$]-[$x_{z1}$ $x_{z2}$ . . . $x_{zt}$], respectively. The first sum $Y_p$ and the second through $p^{th}$ sums $Y_1$-$Y_{(p-1)}$ are individually added with '1' to determine which of the $(p+1)^{th}$ through $(2*p)^{th}$ data bits are erroneous. Thus, the PCSC 100 determines which of the first through $n^{th}$ data bits are erroneous data bits in 'n/p' cycles.

The above-described PCSC 100 is widely used in Application Specific Integrated Circuits (ASICs) associated with data error correction, as such ASICs offer a high degree of freedom to implement larger and complicated digital logic circuits. However, for implementing the PCSC 100 in an FPGA (not shown), data bits associated with the equation (1) are mapped into the FPGA which results in utilization of a large number of look-up tables (LUTs) in the FPGA. The utilization of the large number of LUTs results in complex interconnect routing among the LUTs in the FPGA, and an increase in power consumed by the conventional BCH decoder that includes the PCSC 100. Further, the conventional BCH decoder occupies a significant area on the FPGA due to the utilization of the large number of LUTs.

In light of the foregoing, it would be advantageous to have a method that simplifies logic associated with a PCSC and implements a BCH decoder which includes the PCSC that consumes low power and area as compared to conventional PCSCs.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIGS. 3A-3C, collectively, illustrate a representation of logic simplification of data bits associated with a PCSC of the BCH decoder by using an electronic design automation (EDA) tool in accordance with an embodiment of the present invention;

DETAILED DESCRIPTION

Figure 1:
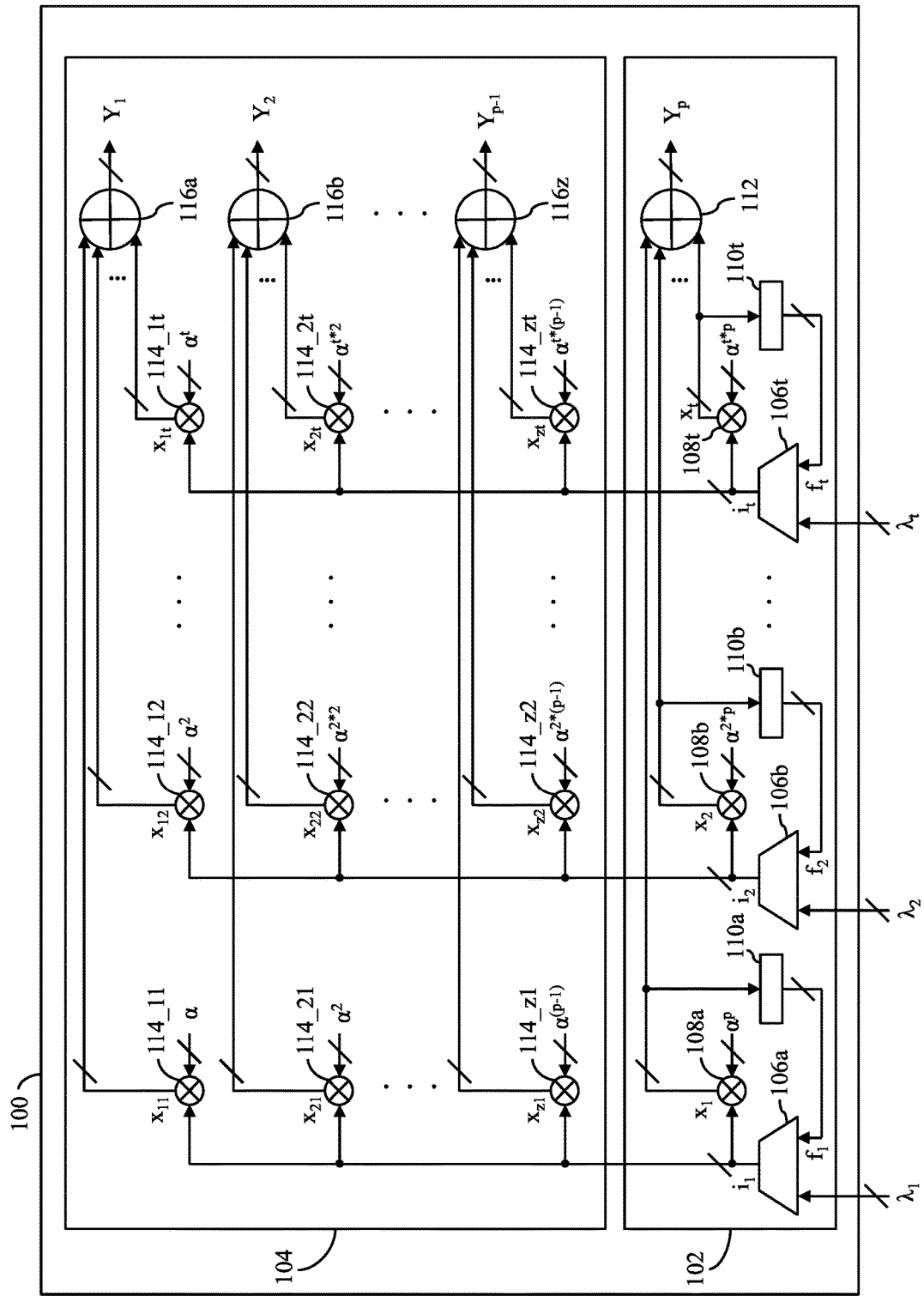
FIG. 1 illustrates a block diagram of a conventional parallel Chien search circuit (PCSC) of a conventional Bose-Chaudhuri-Hocquenghem (BCH) decoder.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment, the present invention provides a method for implementing a decoder in a field programmable gate array (FPGA) by using an electronic design automation (EDA) tool. The FPGA includes a plurality of look-up table (LUT) clusters. The method includes arranging a first plurality of expressions in a first plurality of rows and a first plurality of columns of a binary matrix. A first expression of the first plurality of expressions is arranged in a first row of the first plurality of rows such that a plurality of data bits associated with the first expression are arranged in the first plurality of columns. The method further includes forming a plurality of submatrices based on the binary matrix. A first submatrix of the plurality of submatrices includes a second plurality of rows and a second plurality of columns of the first plurality of rows and the first plurality of columns, respectively. The second plurality of rows have common data bits in one or more columns of the second plurality of columns. The method further includes determining a set of subexpressions for each submatrix of the plurality of submatrices based on the common data bits associated with each submatrix. The method further includes mapping the set of subexpressions of each submatrix into one or more LUT clusters of the plurality of LUT clusters, thereby implementing the decoder in the FPGA.

In another embodiment, the present invention provides a non-transitory computer readable medium. The non-transitory computer readable medium stores computer executable instructions, which when executed by a computer, cause the computer to execute operations for implementing a decoder in an FPGA. The FPGA includes a plurality of LUT clusters. The operations include arranging a first plurality of expressions in a first plurality of rows and a first plurality of columns of a binary matrix. A first expression of the first plurality of expressions is arranged in a first row of the first plurality of rows such that a plurality of data bits associated with the first expression are arranged in the first plurality of columns. The operations further include forming a plurality of submatrices based on the binary matrix. A first submatrix of the plurality of submatrices includes a second plurality of rows and a second plurality of columns of the first plurality of rows and the first plurality of columns, respectively. The second plurality of rows have common data bits in one or more columns of the second plurality of columns. The operations further include determining a set of subexpressions for each submatrix of the plurality of submatrices based on the common data bits associated with each submatrix. The operations further include mapping the set of subexpressions of each submatrix into one or more LUT clusters of the plurality of LUT clusters, thereby implementing the decoder in the FPGA.

In yet another embodiment, the present invention provides a decoder implemented in an FPGA. The FPGA includes a plurality of LUT clusters having mapped thereon, by an EDA tool, one or more sets of subexpressions associated with a first plurality of expressions. To determine a first set of subexpressions of the one or more sets of subexpressions, the EDA tool arranges the first plurality of expressions in a first plurality of rows and a first plurality of columns of a binary matrix. A first expression of the first plurality of expressions is arranged in a first row of the first plurality of rows such that a plurality of data bits associated with the first expression are arranged in the first plurality of columns. The determination of the first set of subexpressions further includes forming a plurality of submatrices based on the binary matrix. A first submatrix of the plurality of submatrices includes a second plurality of rows and a second plurality of columns of the first plurality of rows and the first plurality of columns, respectively. The second plurality of rows have common data bits in one or more columns of the second plurality of columns. The first set of subexpressions is associated with the first submatrix, and is determined based on the common data bits.

Various embodiments of the present invention provide a method for implementing a decoder in an FPGA by using an EDA tool. The FPGA includes a plurality of LUT clusters. The EDA tool arranges a first plurality of expressions in a first plurality of rows and a first plurality of columns of a binary matrix. A first expression of the first plurality of expressions is arranged in a first row of the first plurality of rows such that a plurality of data bits associated with the first expression are arranged in the first plurality of columns. The EDA tool further forms a plurality of submatrices based on the binary matrix. The plurality of submatrices are mutually exclusive and collectively exhaustive of the binary matrix. A first submatrix of the plurality of submatrices includes a second plurality of rows and a second plurality of columns of the first plurality of rows and the first plurality of columns, respectively. A first column of the second plurality of columns is consecutive to a second column of the second plurality of columns. A number of columns in the second plurality of columns corresponds to a number of inputs of a LUT cluster of the plurality of LUT clusters, and a number of rows in the second plurality of rows corresponds to a number of inputs of a first LUT of the LUT cluster. The second plurality of rows have common data bits in one or more columns of the second plurality of columns. The common data bits in the one or more columns of the second plurality of columns are binary "1"s.

The EDA tool further determines a set of subexpressions for each submatrix of the plurality of submatrices based on the common data bits associated with each submatrix. The EDA tool further maps the set of subexpressions of each submatrix into one or more LUT clusters of the plurality of LUT clusters, thereby implementing the decoder in the FPGA. Further, a set of output expressions is generated based on the plurality of submatrices and errors in an input message, that is received by the decoder, are determined based on the set of output expressions.

The decoder is implemented by mapping the set of subexpressions associated with each of the plurality of submatrices into the plurality of LUT clusters. Thus, a number of LUTs in the plurality of LUT clusters is less as compared to a number of LUTs in conventional decoders. Due to the reduced number of LUTs, the decoder consumes low power and occupies less area on the FPGA as compared to the conventional decoders.

Figure 2:
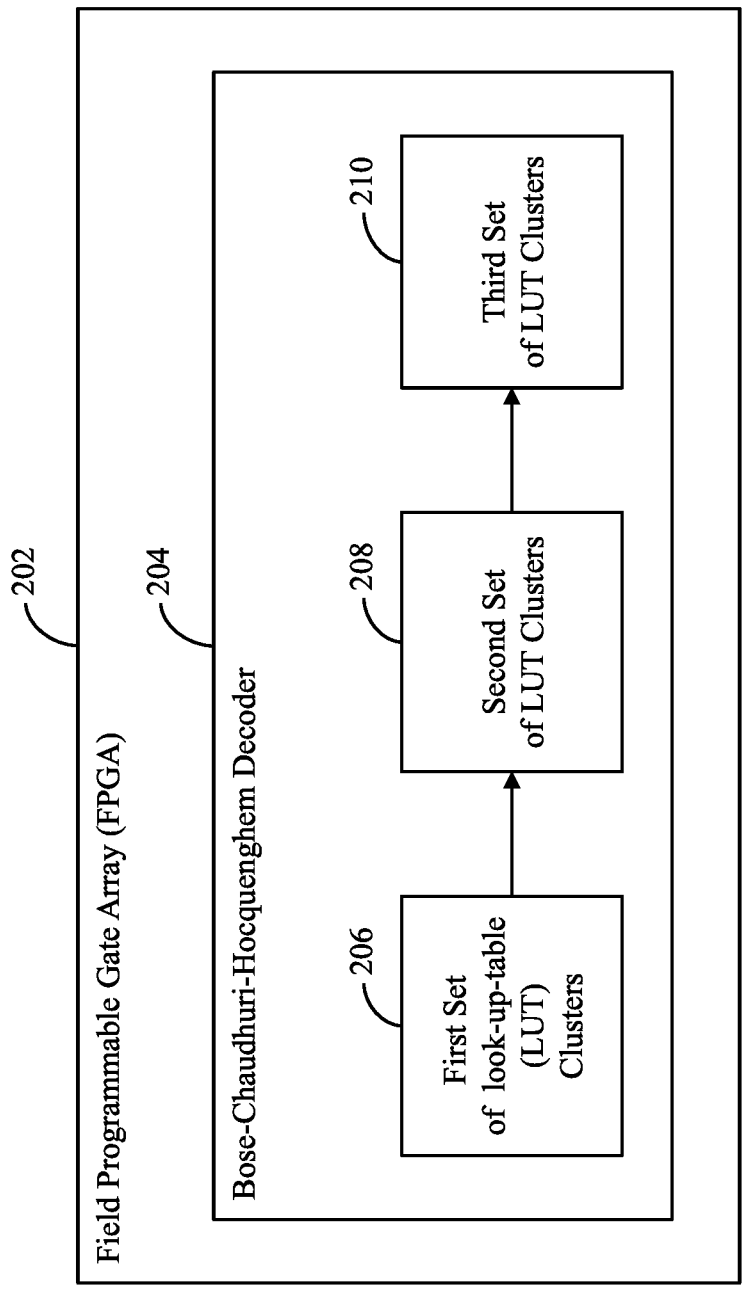
FIG. 2 illustrates a block diagram of a Field Programmable Gate Array (FPGA) that includes a BCH decoder in accordance with an embodiment of the present invention.

FIG. 2 illustrates a block diagram of a Field Programmable Gate Array (FPGA) 202 that includes a Bose-Chaudhuri-Hocquenghem (BCH) decoder 204 in accordance with an embodiment of the present invention. The BCH decoder 204 includes first through third sets of look-up table (LUT) clusters 206 through 210, respectively.

The BCH decoder 204 receives, from a BCH encoder (not shown) over a communication link, a codeword (i.e., an input message) having first through $n^{th}$ encoded data bits. Alternatively, the BCH decoder 204 retrieves the codeword from a first external memory (not shown) over the communication link. It will be apparent to a person skilled in the art that, to identify and correct errors that occur during the reception of data bits by the BCH decoder, the data bits are encoded prior to transmission or storage. The data bits are encoded based on a finite field such as a Galois Field $GF(2^m)$, having a primitive element 'α', where 'm' is a positive integer. A polynomial form of the codeword is shown in equation (1) as:

$$r(x) = r_0 \cdot x^0 + r_1 \cdot x^1 + \ldots + r_{n-1} \cdot x^{n-1} \quad (1)$$

where '$r_0$-$r_{(n-1)}$'; and '$x^0$-$x^{(n-1)}$', represent corresponding magnitudes and positions of the first through $n^{th}$ encoded data bits (hereinafter referred to as, "first through $n^{th}$ data bits"), respectively.

Upon the reception of the codeword, the BCH decoder 204 decodes the codeword to identify erroneous data bits. The decoding of the codeword includes determination of syndrome vectors (i.e., syndrome calculation) based on the codeword. The BCH decoder 204 determines up to '2*t' number of syndrome vectors, where 't' is number of erroneous data bits that may be corrected by the BCH decoder 204. The syndrome vectors are shown in equations (2)-(4) as:

$$S_1 = r_0 + r_1 \cdot \alpha^1 + r_2 \cdot \alpha^2 + \ldots + r_{n-1} \cdot \alpha^{(n-1)} \quad (2)$$

$$S_2 = r_0 + r_1 \cdot \alpha^2 + r_2 \cdot \alpha^{2*2} + \ldots + r_{n-1} \cdot \alpha^{2*(n-1)} \quad (3)$$

...

$$S_{2*t} = r_0 + r_1 \cdot \alpha^{2*t} + r_2 \cdot \alpha^{2*t*2} + \ldots + r_{n-1} \cdot \alpha^{2*t*(n-1)} \quad (4)$$

The equations (2)-(4) are mapped into the first set of LUT clusters 206, i.e., the first set of LUT clusters 206 stores, based on finite field arithmetic (i.e., the Galois Filed arithmetic), all possible combinations of data bits associated with the equations (2)-(4). An electronic design automation (EDA) tool (shown in FIG. 5) maps the data bits associated with equation (2)-(4) into the first set of LUT clusters 206. Thus, the first set of LUT clusters 206 corresponds to the determination of the syndrome vectors.

The decoding of the codeword further includes determination of an error locator polynomial (ELP) based on the syndrome vectors. A key equation solver (KES) circuit (not shown) associated with the BCH decoder 204 determines the ELP. The ELP is determined based on one or more equations associated with the KES circuit. The one or more equations may correspond to a Euclidean algorithm, a Peterson-Gorenstein-Zierler algorithm, a Berlekamp-Massey algorithm, or the like. Further, the one or more equations are mapped into the second set of LUT clusters 208 by the EDA tool. Thus, the second set of LUT clusters 208 corresponds to the determination of the ELP. The ELP thus determined is shown in equation (5), and alternatively in equation (6) as:

$$\lambda(x) = 1 + \lambda_1 \cdot x^1 + \lambda_2 \cdot x^2 + \ldots + \lambda_{t'} \cdot x^{t'} \quad (5)$$

$$[\lambda(x) - 1] = \lambda_1 \cdot x^1 + \lambda_2 \cdot x^2 + \ldots + \lambda_{t'} \cdot x^{t'} \quad (6)$$

The decoding of the codeword further includes identification of the erroneous data bits in the codeword by solving the ELP of equation (6) based on a Chien search algorithm. A parallel Chien search circuit (PCSC) (shown in FIG. 4) associated with the BCH decoder 204 solves the ELP of equation (6) to identify the erroneous data bits in the codeword. The field elements of the Galois Field $GF(2^m)$, having the primitive element 'α', are $\{0 \; \alpha^1 \; \alpha^2 \ldots \alpha^{(p-1)}$ $\alpha^p \; \alpha^{(p+1)} \ldots \alpha^{((2[<]BEGINITALmm)-1)}\}$. Solving the ELP of equation (6), i.e., determining roots of the equation (6), based on the Chien search algorithm includes substituting variable 'x' in the equation (6) with non-zero field elements of the Galois Field $GF(2^m)$ that are associated with the codeword (i.e., the first through $n^{th}$ data bits). Therefore, $x = \{\alpha^1 \; \alpha^2 \ldots \alpha^{(p-1)} \; \alpha^p \; \alpha^{(p+1)} \ldots \alpha^n\}$, such that '$n \leq (2^m - 1)$'. Thus, the ELP of equation (6) is solved for $x = \alpha$ through $x = \alpha^n$, that generates first through $n^{th}$ sums $Y_1$-$Y_n$. The first through $n^{th}$ sums $Y_1$-$Y_n$ correspond to a set of output expressions of the BCH decoder 204. The first through $n^{th}$ sums $Y_1$-$Y_n$ are shown in equations (7)-(14) as:

$$Y_1 = [\lambda(x) - 1]|_{x=\alpha^1} = \lambda_1 \cdot \alpha^1 + \lambda_2 \cdot \alpha^2 + \ldots + \lambda_{t'} \cdot \alpha^{t'} \quad (7)$$

$$Y_2 = [\lambda(x) - 1]|_{x=\alpha^2} = \lambda_1 \cdot \alpha^2 + \lambda_2 \cdot \alpha^{2*2} + \ldots + \lambda_{t'} \cdot \alpha^{t'*2} \quad (8)$$

...

$$Y_{p-1} = [\lambda(x) - 1]|_{x=\alpha^{p-1}} = \lambda_1 \cdot \alpha^{p-1} + \lambda_2 \cdot \alpha^{2*(p-1)} + \ldots + \lambda_{t'} \cdot \alpha^{t'*(p-1)} \quad (9)$$

$$Y_p = [\lambda(x) - 1]|_{x=\alpha^p} = \lambda_1 \cdot \alpha^p + \lambda_2 \cdot \alpha^{2*p} + \ldots + \lambda_{t'} \cdot \alpha^{t'*p} \quad (10)$$

$$Y_{p+1} = [\lambda(x) - 1]|_{x=\alpha^{p+1}} = \lambda_1 \cdot \alpha^{p+1} + \lambda_2 \cdot \alpha^{2*(p+1)} + \ldots + \lambda_{t'} \cdot \alpha^{t'*(p+1)} \quad (11)$$

...

$$Y_{2*p} = [\lambda(x) - 1]|_{x=\alpha^{2*p}} = \lambda_1 \cdot \alpha^{2*p} + \lambda_2 \cdot \alpha^{2*2} + \ldots + \lambda_{t'} \cdot \alpha^{t'*2*p} \quad (12)$$

$$Y_{(2*p+1)} = [\lambda(x) - 1]|_{x=\alpha^{2*p+1}} = \lambda_1 \cdot \alpha^{(2*p+1)} + \ldots + \lambda_{t'} \cdot \alpha^{t'*(2*p+1)} \quad (13)$$

...

$$Y_n = [\lambda(x) - 1]|_{x=\alpha^n} = \lambda_1 \cdot \alpha^n + \lambda_2 \cdot \alpha^{2*n} + \ldots + \lambda_{t'} \cdot \alpha^{t'*n} \quad (14)$$

It will be apparent to a person skilled in the art that the equations (7)-(14) may similarly be obtained by substituting $x = \{\alpha^1 \; \alpha^2 \ldots \alpha^{(p-1)} \; \alpha^p \; \alpha^{(p+1)} \ldots \alpha^n\}$ in the equation (5).

The first sum $Y_1$ indicates whether the first data bit is erroneous, the second sum $Y_2$ indicates whether the second data bit is erroneous, the $p^{th}$ sum $Y_p$ indicates whether the $p^{th}$ data bit is erroneous, and the $n^{th}$ sum indicates whether the $n^{th}$ data bit is erroneous. The equations (7)-(14) are solvable in first through $(n/p+1)^{th}$ cycles by the PCSC, where 'p' is number of data bits processed per cycle for solving the ELP of equation (6). In the first and second cycles, the equations (7)-(10) are solved simultaneously to generate the first through $p^{th}$ sums $Y_1$-$Y_p$. Evaluated terms of the equation (10) (i.e., $\lambda_1 \cdot \alpha^p, \lambda_2 \cdot \alpha^{2*p}, \ldots, \lambda_{t'} \cdot \alpha^{t'*p}$) replace the coefficients of the equations (7)-(9) (i.e., $\lambda_1, \lambda_2, \ldots, \lambda_{t'}$), and the equations (11)-(12) are solved simultaneously to generate the $(p+1)^{th}$ through $(2*p)^{th}$ sums $Y_{(p+1)}$-$Y_{2*p}$ in the third cycle. Likewise, the equations (13)-(14) are solved in the fourth through $(n/p+1)^{th}$ cycles. The data bits associated with the equations (7)-(9) are logic simplified and mapped into the third set of LUT clusters 210. Thus, the third set of LUT clusters 210 corresponds to the identification of the erroneous data bits in the codeword based on the Chien search algorithm. The logic simplification of the data bits associated with the equations (7)-(9) is illustrated in FIGS. 3A-3C.

Figure 3A:
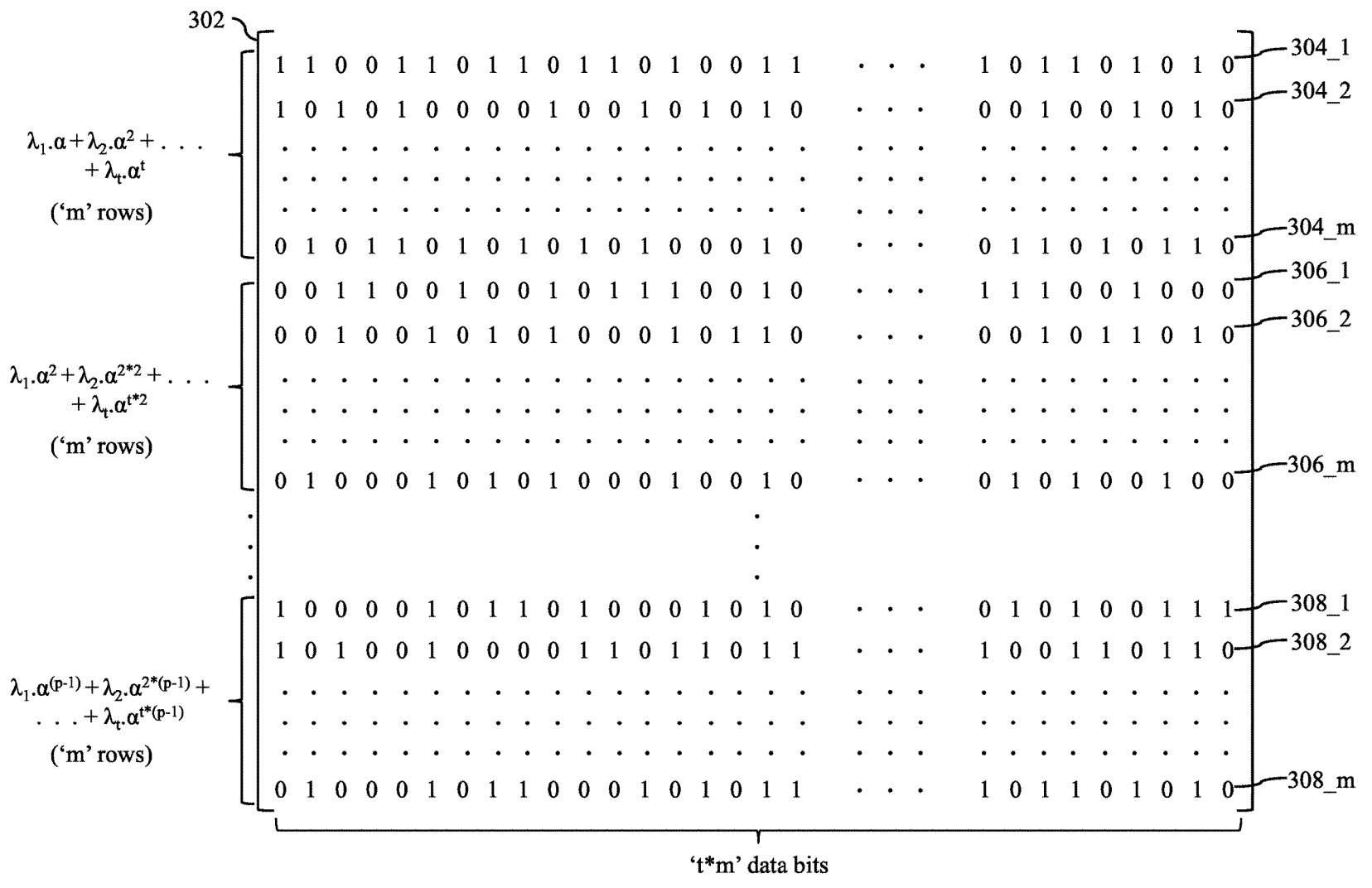
Figure 3B:
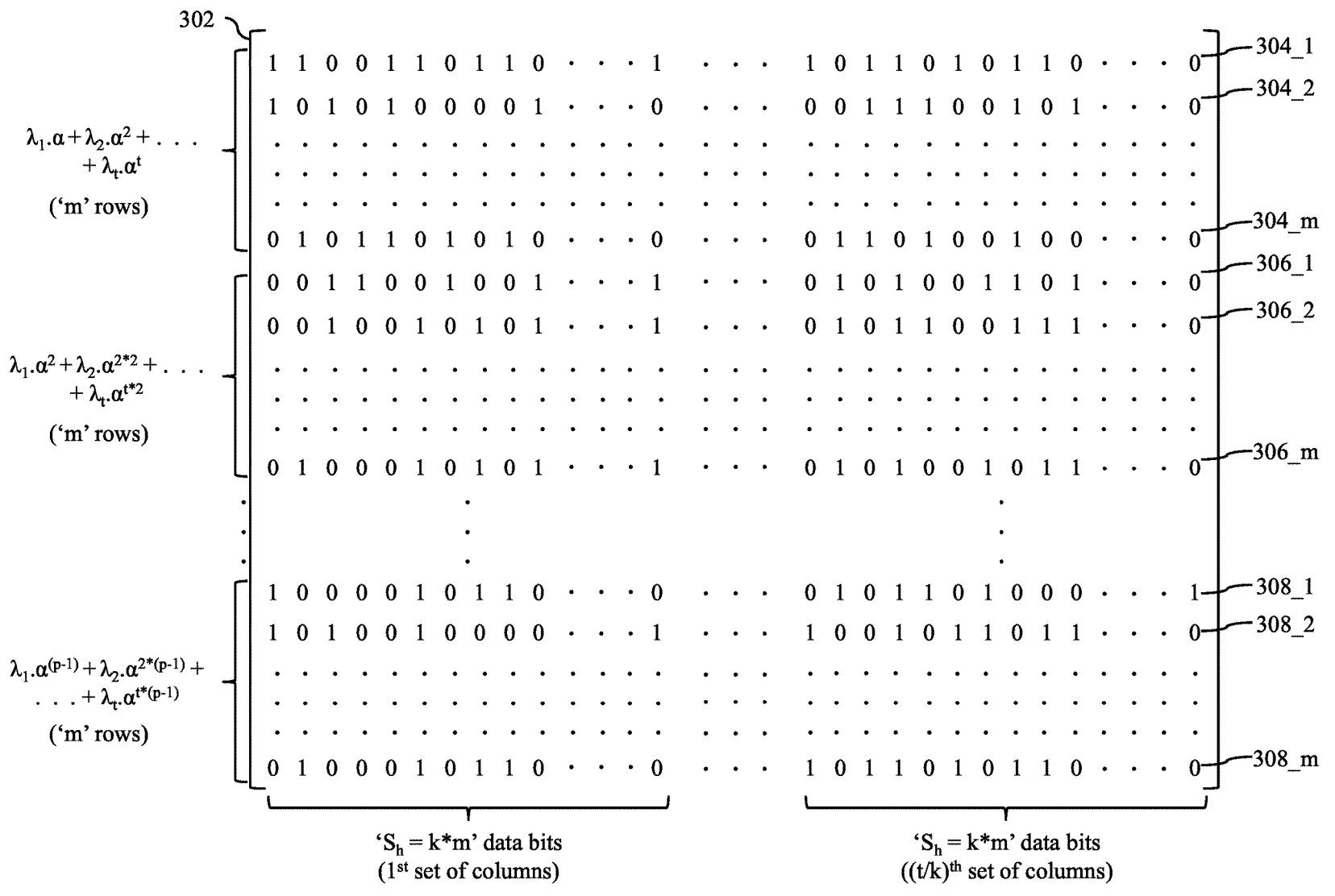
Figure 3C:
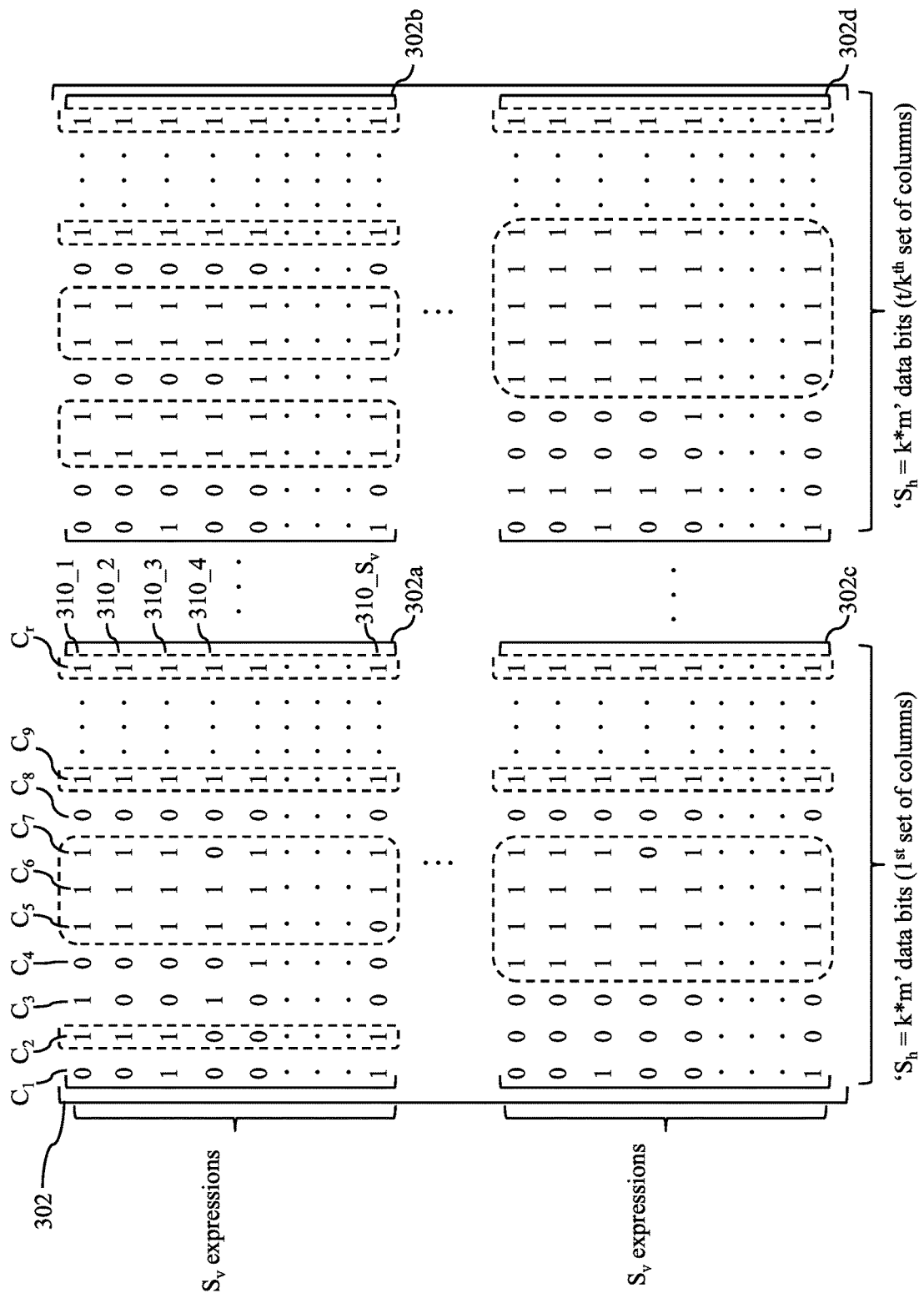

FIGS. 3A-3C, collectively, illustrate a representation of logic simplification of data bits associated with the PCSC (i.e., the data bits associated with the equations (7)-(9)) by using the EDA tool in accordance with an embodiment of the present invention. FIG. 3A illustrates a representation of the arrangement of the equations (7)-(9) as binary expressions in a binary matrix 302 by the EDA tool, based on the finite field arithmetic. For the Galois Field $GF(2^m)$, each field element is m-bit wide. As the field elements are constant for a value of 'm' (such as 'm=14'), a multiplication of two field elements (which typically includes logical XOR and logical AND operations) is reduced to a logical XOR operation. Further, the multiplication generates a third field element which is m-bit wide. Hence, each of the equations (7)-(9) constitutes a total of 't*m' number of data bits. The binary matrix 302 thus includes 't*m' number of columns such that each column is one-bit wide. Furthermore, when the primitive element 'a' is known, each of the equations (7)-(9) has 'm' possible arrangements of binary expressions based on the finite field arithmetic. Thus, the binary matrix 302 includes '(p−1)*m' number of rows 304_1-308_m. The equation (7) is arranged in rows 304_1-304_m, the equation (8) is arranged in rows 306_1-306_m, and the equation (9) is arranged in rows 308_1-308_m.

FIG. 3B illustrates a representation of the segregation of the 't*m' number of columns of the binary matrix 302 into 't/k' sets of columns by the EDA tool. A first set of columns of the 't/k' sets of columns includes '$S_h$' number of columns such that '$S_h$' is an integer multiple of 'm' (i.e., $S_h$=k*m). The '$S_h$' columns of each set of columns are consecutive (i.e., a first column of the first set of columns is consecutive to a second column of the first set of columns). Further, the EDA tool iteratively determines '((p−1)*m)/$S_v$' sets of rows such that the '((p−1)*m)/$S_v$' sets of rows are mutually exclusive and collectively exhaustive of the rows 304_1-308_m. Each set of rows includes '$S_v$' number of rows. Further, a first set of rows includes maximum number of common data bits (i.e., common "1"s) in the first set of columns. The EDA tool combines together a part of each row of the first set of rows that is associated with the first set of columns to form a first submatrix (shown in FIG. 3C) of a set of submatrices. Thus, a size of the first submatrix is [$S_v \times S_h$]. Likewise, the EDA tool iteratively determines remaining sets of rows to form the set of submatrices. The set of submatrices includes 'q' number of submatrices such that 'q' is equal to '((p−1)*m/$S_v$)*(t*m/$S_h$)'. The set of submatrices is mutually exclusive and collectively exhaustive of the binary matrix 302.

The EDA tool determines a size of each submatrix (i.e., '$S_v$' number of rows and '$S_h$' number of columns) based on a number of inputs of a LUT cluster of the FPGA 202 and a number of inputs of each LUT included in the LUT cluster. In an example, p=64, t=60, and m=14 (i.e., the PCSC performs the finite field arithmetic based on a Galois Field GF($2^{14}$)). The binary matrix 302 thus includes (p−1)*m=882 rows and t*m=840 columns. When the LUT cluster includes six-input LUTs, the EDA tool may determine six sets of rows such that a number of rows in each set of rows is equal to 147 (i.e., $S_v$=882/6=147). Alternatively, the EDA tool may determine five sets of rows such that four of the five sets of rows include 176 rows each (i.e., $S_v$=704/4=176) and the fifth set of rows includes 178 rows. Thus, the five sets of rows collectively include 882 rows. The EDA tool further determines '$S_h$' number of columns such that '$S_h$' is an integer factor of 't*m'. For example, the EDA tool may determine an integer factor '10' such that $S_h$ is equal to 84 (i.e., 840/10). Further, the EDA tool determines '$S_h$' number of columns such that '$_{Sh}$' is an integer multiple of 'm', i.e., $S_h$=k*m.

The EDA tool selects values of $S_v$ and $S_h$, i.e., selects case (i) $S_v$=147 and $S_h$=84 or case (ii) $S_v$=(176,178) and $S_h$=84, based on a number of LUTs in the third set of LUT clusters 210 for each case, area occupied by the BCH decoder 204 on the FPGA 202 for each case, power consumed by the BCH decoder 204 for each case, and interconnect routing complexity among different LUT clusters of the BCH decoder 204 for each case.

FIG. 3C illustrates a representation of the first submatrix (hereinafter designated as, "first submatrix 302a") and second through fourth submatrices 302b-302d of the set of submatrices. The EDA tool simplifies logic associated with the first submatrix 302a. The first submatrix 302a includes '$S_v$' number of rows 310_1-310_$S_v$. The first submatrix 302a further includes first through $r^{th}$ columns (hereinafter referred to as, "columns $C_1$-$C_r$") such that r=$S_h$. Each row of the first submatrix 302a corresponds to a partial output expression. The partial output expressions $O_1$-$O_{Sv}$ corresponding to the rows 310_1-310_$S_v$ are shown in equations (15)-(20):

$$O_1 = C_2 + C_3 + C_5 + C_6 + C_7 + C_9 + \ldots + C_r \qquad (15)$$

$$O_2 = C_2 + C_5 + C_6 + C_7 + C_9 + \ldots + C_r \qquad (16)$$

$$O_3 = + C_2 + C_5 + C_6 + C_7 + C_9 + \ldots + C_r \qquad (17)$$

$$O_4 = C_3 + C_5 + C_6 + C_9 + \ldots + C_r \qquad (18)$$

$$O_5 = C_4 + C_5 + C_6 + C_7 + C_9 + \ldots + C_r \qquad (19)$$

$$\ldots$$

$$O_{Sv} = C_1 + C_2 + C_6 + C_7 + C_9 + \ldots + C_r \qquad (20)$$

The columns $C_2$, $C_5$, $C_6$, $C_7$, $C_9$, and $C_r$ are common in most of the equations (15)-(20). Thus, the columns $C_2$, $C_5$, $C_6$, $C_7$, $C_9$, and $C_r$ are collectively reduced, i.e., the columns $C_2$, $C_5$, $C_6$, $C_7$, $C_9$, and $C_r$ are mapped into an individual LUT (e.g., a six-input LUT) of the third set of LUT clusters 210 by the EDA tool. The EDA tool combines the columns $C_2$, $C_5$, $C_6$, $C_7$, $C_9$, and $C_r$ to form a first subexpression $W_1$. The first subexpression $W_1$ is shown in equation (21):

$$W_1 = C_2 + C_5 + C_6 + C_7 + C_9 + C_r \qquad (21)$$

Substituting the equation (21) in the equations (15)-(20) forms subexpressions as shown in equations (22)-(27):

$$O_1 = W_1 + \ldots + C_3 \qquad (22)$$

$$O_2 = W_1 \qquad (23)$$

$$O_3 = W_1 + \ldots + C_1 \qquad (24)$$

$$O_4 = + C_2 + C_3 + \ldots + C_7 \qquad (25)$$

$$O_5 = W_1 + C_2 + \ldots + C_4 \qquad (26)$$

$$\ldots$$

$$O_{sv} = W_1 + C_1 + \ldots + C_5 \qquad (27)$$

The EDA tool similarly reduces multiple columns to form multiple subexpressions (e.g., subexpressions $W_2 \ldots W_u$). A count of subexpressions (i.e., a value of 'u') may vary based on logic simplification of data bits associated with the corresponding submatrices. Thus, the EDA tool forms a first set of subexpressions for the first submatrix 302a. The first set of subexpressions includes the subexpressions [$W_1$ $W_2$ ... $W_u$ $O_1$ $O_2$ ... $O_{Sv}$]. Similarly, the EDA tool determines a set of subexpressions for each of remaining submatrices (such as the second through fourth submatrices 302b-302d), based on data bits associated with corresponding rows and columns.

Although the present invention describes the logic simplification of data bits associated with the equations (7)-(9), the scope of the present invention is not limited to it. The logic simplification of data bits associated with the syndrome calculation (i.e., the equations (2)-(4)) may be performed similarly, without deviating from the scope of the present invention. In such a scenario, the EDA tool arranges the equations (2)-(4) as binary expressions in a binary matrix (such as the binary matrix 302).

Figure 4:
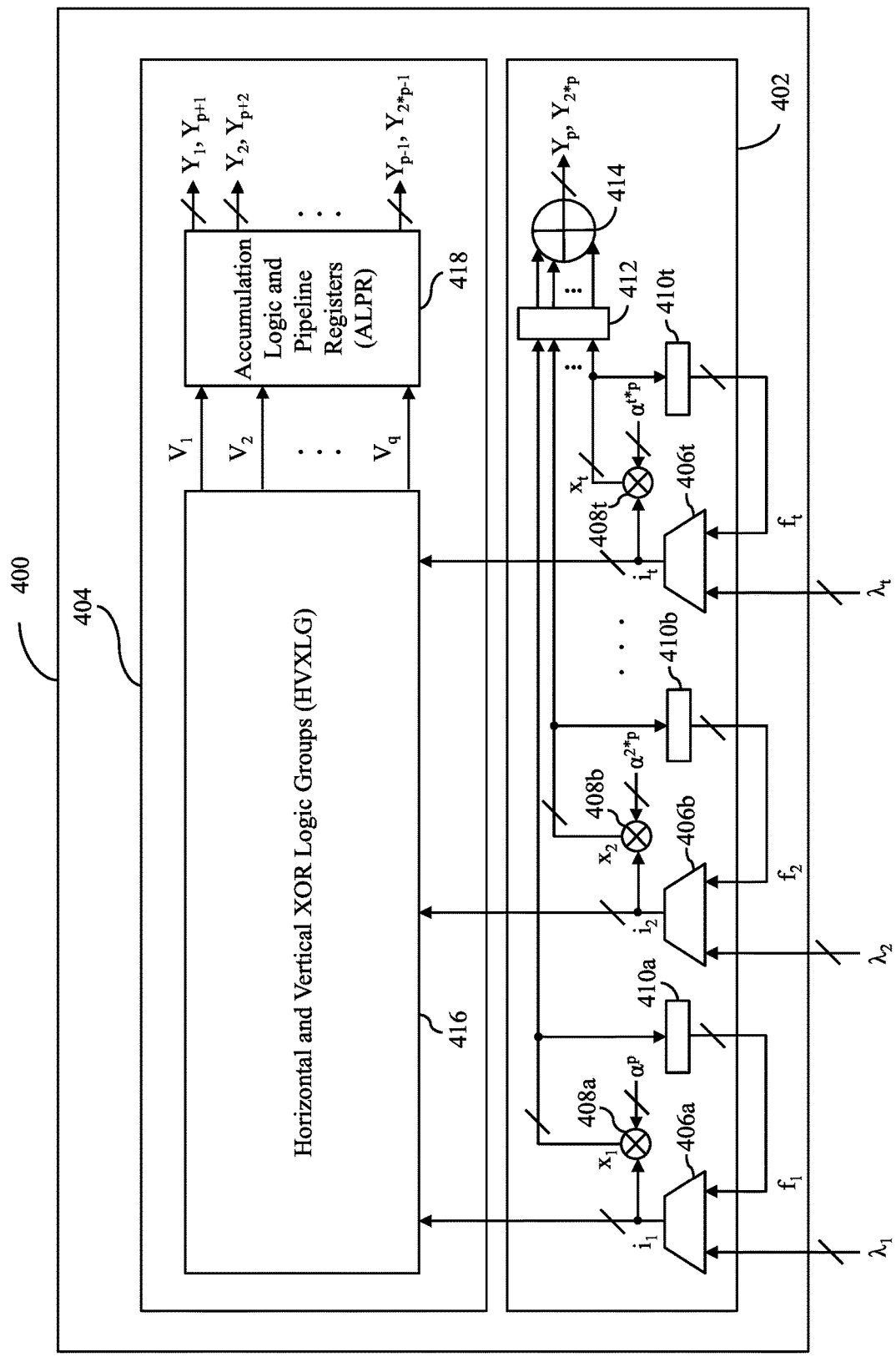
FIG. 4 illustrates a block diagram of the PCSC in accordance with an embodiment of the present invention.

FIG. 4 illustrates a block diagram of the PCSC (hereinafter designated as, "PCSC 400") in accordance with an embodiment of the present invention. The PCSC 400 solves the ELP of equation (6) to identify the erroneous data bits in the codeword in the first through $(n/p+1)^{th}$ cycles. The PCSC 400 includes a feedback circuit 402 and a substitution circuit 404. The feedback circuit 402 corresponds to a first subset of LUT clusters of the third set of LUT clusters 210. The substitution circuit 404 corresponds to second and third subsets of LUT clusters of the third set of LUT clusters 210. The PCSC 400 is connected to a second external memory (not shown) which stores the field elements $\{\alpha^1 \alpha^2 \ldots \alpha^{(p-1)} \alpha^p \alpha^{(p+1)} \ldots \alpha^n\}$.

The feedback circuit 402 includes first through $t^{th}$ multiplexers 406a-406t, first through $t^{th}$ multipliers 408a-408t (hereinafter collectively referred to as, "multipliers 408"), first through $t^{th}$ registers 410a-410t, a set of accumulation registers 412 (hereinafter referred to as, "accumulation registers 412"), and an adder 414. The first multiplexer 406a receives a first input $\lambda_1$ from the KES circuit. The first multiplexer 406a is connected to the first register 410a for receiving a second input $f_1$. The first multiplexer 406a selects and outputs one of the first or second inputs $\lambda_1$ or $f_1$ based on a select line (not shown). Similarly, the second through $t^{th}$ multiplexers 406b-406t receive corresponding first inputs $\lambda_2$-$\lambda_t$ from the KES circuit or second inputs $f_2$-$f_t$ from the second through $t^{th}$ registers 410b-410t, respectively. The second through $t^{th}$ multiplexers 406b-406t select and output one of the corresponding first inputs $\lambda_2$-$\lambda_t$ or second inputs $f_2$-$f_t$, respectively, based on the corresponding select lines.

The first multiplier 408a is connected to the first multiplexer 406a for receiving a third input $i_1$, i.e., an output ($\lambda_1$ or $f_1$) of the first multiplexer 406a. The first multiplier 408a is further connected to the second external memory for receiving a fourth input $\alpha^p$. The first multiplier 408a multiplies the third and fourth inputs $i_1$ and $\alpha^p$, and generates a first multiplication output $x_1$. The first register 410a is connected to the first multiplier 408a for receiving the first multiplication output $x_1$. The first register 410a may be a D-latch that outputs the first multiplication output $x_1$ when the first register 410a is triggered by a clock signal (not shown). Similarly, the second through $t^{th}$ multipliers 408b-408t are connected to the second through $t^{th}$ multiplexers 406b-406t for receiving corresponding third inputs $i_2$-$i_t$ and the second external memory for receiving corresponding fourth inputs $\alpha^{(2*p)}$-$\alpha^{(t*p)}$. The second through $t^{th}$ multipliers 408b-408t multiply the corresponding third and fourth inputs $i_2$-$i_t$ and $\alpha^{(2*p)}$-$\alpha^{(t*p)}$, and generate second through $t^{th}$ multiplication outputs $x_2$-$x_t$, respectively. The second through $t^{th}$ registers 410b-410t are connected to the second through $t^{th}$ multipliers 408b-408t for receiving the second through $t^{th}$ multiplication outputs $x_2$-$x_t$, respectively. Further, the accumulation registers 412 are connected to the multipliers 408 for receiving the first through $t^{th}$ multiplication outputs $x_1$-$x_t$, respectively. The adder 414 is connected to the accumulation registers 412 for receiving the first through $t^{th}$ multiplication outputs $x_1$-$x_t$. The adder 414 generates the $p^{th}$ sum $Y_p$ based on a summation of the first through $t^{th}$ multiplication outputs $x_1$-$x_t$. The feedback circuit 402 is mapped into the first subset of LUT clusters.

The substitution circuit 404 includes horizontal and vertical XOR logic groups (HVXLG) 416, and accumulation logic and pipeline registers (ALPR) 418. The HVXLG 416 corresponds to the second subset of LUT clusters. The HVXLG 416 includes LUTs having mapped thereon, the set of subexpressions of each submatrix. Further, the HVXLG 416 receives corresponding third inputs $i_1$-$i_t$ from the first through $t^{th}$ multiplexers 406a-406t, respectively, and outputs a set of subexpression vectors $[V_1 V_2 \ldots V_q]$ based on the corresponding third inputs $i_1$-$i_t$. Each subexpression vector is associated with a corresponding submatrix. For example, the subexpression vector $V_1$ is associated with the first submatrix 302a, the subexpression vector $V_2$ is associated with the second submatrix 302b, the subexpression vector $V_q$ is associated with the $q^{th}$ submatrix (not shown in FIG. 3C). Each subexpression vector includes a combination of data bits associated with one or more subexpressions of the respective sets of subexpressions. For example, the subexpression vector $V_1$ associated with the first submatrix 302a includes, based on the corresponding third inputs $i_1$-$i_t$, a combination of data bits associated with a subset of subexpressions (i.e., $[O_1 \ldots O_{Sv}]$) of the first set of subexpressions $[W_1 \ldots W_u O_1 \ldots O_{Sv}]$.

The ALPR 418 is connected to the HVXLG 416 for receiving the set of subexpression vectors $[V_1 V_2 \ldots V_q]$. The ALPR 418 corresponds to the third subset of LUT clusters. The ALPR 418 includes LUTs, having mapped thereon, equations associated with an accumulation logic circuitry. The accumulation logic circuitry identifies, based on the equations (7)-(9), subexpressions from the set of subexpression vectors $[V_1 V_2 \ldots V_q]$ that are to be accumulated in order to generate the first through $(p-1)^{th}$ sums $Y_1$-$Y_{(p-1)}$. For accumulating the subexpressions, the accumulation logic circuitry performs addition of the subexpressions based on the finite field arithmetic associated with the Galois Field $GF(2^m)$. The ALPR 418 further includes flip-flops to implement single-stage pipelining. The single-stage pipelining enables the ALPR 418 to receive and store a set of subexpression vectors in a present cycle, and generates the first through $(p-1)^{th}$ sums $Y_1$-$Y_{(p-1)}$ based on a set of subexpression vectors received in a previous cycle, simultaneously. Thus, the flip-flops store the set of subexpression vectors $[V_1 V_2 \ldots V_q]$ for at least one cycle of operation of the PCSC 400.

In operation, the first through $t^{th}$ multiplexers 406a-406t receive the corresponding first inputs $\lambda_1$-$\lambda_t$ from the KES circuit, in the first cycle. The first through $t^{th}$ multiplexers 406a-406t output the corresponding first inputs $\lambda_1$-$\lambda_t$, i.e., $i_1$-$i_t$=$\lambda_1$-$\lambda_t$. The first through $t^{th}$ multipliers 408a-408t receive the corresponding third inputs $\lambda_1$-$\lambda_t$ from the first through $t^{th}$ multiplexers 406a-406t, respectively, and the corresponding fourth inputs $\alpha^p$-$\alpha^{(t*p)}$ from the second external memory. The first through $t^{th}$ multipliers 408a-408t multiply the corresponding third and fourth inputs $\lambda_1$-$\lambda_t$ and $\alpha^p$-$\alpha^{(t*p)}$, and generate first through $t^{th}$ multiplication outputs $x_1$-$x_t$, respectively. The accumulation registers 412 receive the first through $t^{th}$ multiplication outputs $x_1$-$x_t$ from the first through $t^{th}$ multipliers 408a-408t, respectively. Similarly, the first through $t^{th}$ registers 410a-410t receive the first through $t^{th}$ multiplication outputs $x_1$-$x_t$ from the first through $t^{th}$ multipliers 408a-408t, respectively. The accumulation registers 412 store the first through $t^{th}$ multiplication outputs $x_1$-$x_t$ for synchronization with the substitution circuit 404 (i.e., the accumulation registers 412 store the first through $t^{th}$ multiplication outputs $x_1$-$x_t$ for transmitting to the adder 414 in the second cycle).

The HVXLG 416 receives the corresponding third inputs $i_1$-$i_t$=$\lambda_1$-$\lambda_t$ from the feedback circuit 402. The HVXLG 416 outputs the set of subexpression vectors $[V_1 V_2 \ldots V_q]$ based on the corresponding third inputs $i_1$-$i_t$. The ALPR 418 receives the set of subexpression vectors $[V_1 V_2 \ldots V_q]$ from the HVXLG 416 and stores the set of subexpression vectors $[V_1 V_2 \ldots V_q]$ in the flip-flops for accumulation in the second cycle.

In the second cycle, the ALPR 418 identifies, based on the equations (7)-(9), subexpressions from the set of subexpression vectors $[V_1 V_2 \ldots V_q]$ that are to be accumulated for generating the first through $(p-1)^{th}$ sums $Y_1$-$Y_{(p-1)}$. Further, the adder 414 receives, from the accumulation registers 412, the first through $t^{th}$ multiplication outputs $x_1$-$x_t$ of the first cycle, and generates the $p^{th}$ sum $Y_p$. For identifying the erroneous data bits from the first through $p^{th}$ data bits, each of the first through $p^{th}$ sums $Y_1$-$Y_p$ is individually added with '1' by an adder (not shown) that is external to the PCSC 400. For example, to check whether the first data bit is erroneous, '1' is added with the first sum $Y_1$. If '$1+Y_1$'='0', it indicates that the first data bit is erroneous. In order to correct the error, the first data bit is inverted.

In the second cycle, further, the first through $t^{th}$ multiplexers 406a-406t receive the corresponding second inputs $f_1$-$f_t$ from the first through $t^{th}$ registers 410a-410t, respectively. The second inputs $f_1$-$f_t$ are equal to the first through $t^{th}$ multiplication outputs $x_1$-$x_t$ of the first cycle, respectively. The first through $t^{th}$ multiplexers 406a-406t select and output the corresponding second inputs $f_1$-$f_t$, i.e., $i_1$-$i_t$=$f_1$-$f_t$=$\lambda_1 \cdot \alpha^p$-$\lambda_t \cdot \alpha^{t*p}$. The first through $t^{th}$ multipliers 408a-408t receive the corresponding third inputs $f_1$-$f_t$ from the first through $t^{th}$ multiplexers 406a-406t and the corresponding fourth inputs $\alpha^p$-$\alpha^{(t*p)}$ from the second external memory, respectively. The first through $t^{th}$ multipliers 408a-408t multiply the corresponding third and fourth inputs $f_1$-$f_t$ and $\alpha^p$-$\alpha^{(t*p)}$, and generate first through $t^{th}$ multiplication outputs $x_1$-$x_t$, respectively. The accumulation registers 412 store the first through $t^{th}$ multiplication outputs $x_1$-$x_t$ for synchronization with the substitution circuit 404 (i.e., the accumulation registers 412 store the first through $t^{th}$ multiplication outputs $x_1$-$x_t$ for transmitting to the adder 414 in the third cycle).

The HVXLG 416 receives the corresponding third inputs $i_1$-$i_t$=$f_1$-$f_t$ from the feedback circuit 402. The HVXLG 416 outputs the set of subexpression vectors $[V_1 V_2 \ldots V_q]$ based on the corresponding third inputs $i_1$-$i_t$. The ALPR 418 receives the set of subexpression vectors $[V_1 V_2 \ldots V_q]$ and stores the set of subexpression vectors $[V_1 V_2 \ldots V_q]$ in the flip-flops for accumulation in the third cycle.

In the third cycle, the ALPR 418 identifies, from the set of subexpression vectors $[V_1 V_2 \ldots V_q]$ received in the second cycle, subexpressions that are to be accumulated for generating the $(p+1)^{th}$ through $(2*p-1)^{th}$ sums $Y_{(p+1)}$-$Y_{(2*p-1)}$. Further, the adder 414 receives the first through $t^{th}$ multiplication outputs $x_1$-$x_t$ of the second cycle from the accumulation registers 412, and generates the $(2*p)^{th}$ sum $Y_{2*p}$. The $(p+1)$ sum $Y_{(p+1)}$ indicates whether the $(p+1)^{th}$ data bit is erroneous, the $(p+2)$ sum $Y_{(p+2)}$ indicates whether the $(p+2)^{th}$ data bit is erroneous, and the $(2*p)^{th}$ sum $Y_{2*p}$ indicates whether the $(2*p)^{th}$ data bit is erroneous. Further in the third cycle, the first through $t^{th}$ multiplexers 406a-406t select and output the corresponding second inputs $f_1$-$f_t$=$\lambda_1 \cdot \alpha^{2*p}$-$\lambda_t \cdot \alpha^{t*2*p}$, respectively. Thus, $i_1$-$i_t$=$f_1$-$f_t$=$\lambda_1 \cdot \alpha^{2*p}$-$\lambda_t \cdot \alpha^{t*2*p}$. The first through $t^{th}$ multipliers 408a-408t receive the corresponding third inputs $f_1$-$f_t$ and fourth inputs $\alpha^p$-$\alpha^{(t*p)}$ from the first through $t^{th}$ multiplexers 406a-406t and the second external memory, respectively. The first through $t^{th}$ multipliers 408a-408t multiply the corresponding third and fourth inputs $f_1$-$f_t$ and $\alpha^p$-$\alpha^{(t*p)}$, and generate first through $t^{th}$ multiplication outputs $x_1$-$x_t$, respectively. The accumulation registers 412 store the first through $t^{th}$ multiplication outputs $x_1$-$x_t$ for synchronization with the substitution circuit 404 (i.e., the accumulation registers 412 store the first through $t^{th}$ multiplication outputs $x_1$-$x_t$ for transmitting to the adder 414 in the fourth cycle).

The HVXLG 416 receives the corresponding third inputs $i_1$-$i_t$ from the feedback circuit 402, and outputs the set of subexpression vectors $[V_1 V_2 \ldots V_q]$ based on the corresponding third inputs $i_1$-$i_t$. The ALPR 418 receives the set of subexpression vectors $[V_1 V_2 \ldots V_q]$ and stores the set of subexpression vectors $[V_1 V_2 \ldots V_q]$ in the flip-flops for accumulation in the fourth cycle.

Thus, the PCSC 400 generates the first through $p^{th}$ sums $Y_1$-$Y_p$, in the second cycle, to determine which of the first through $p^{th}$ data bits are erroneous, and $(p+1)^{th}$ through $(2*p)^{th}$ sums $Y_{(p+1)}$-$Y_{2*p}$, in the third cycle, to determine which of the $(p+1)^{th}$ through $(2*p)^{th}$ data bits are erroneous. Similarly, the PCSC 400 generates the $(2*p+1)^{th}$ through $n^{th}$ sums $Y_{(2*p+1)}$-$Y_n$ (not shown), in the fourth through $(n/p+1)^{th}$ cycles, to determine which of the $(2*p+1)^{th}$ through $n^{th}$ data bits are erroneous.

The set of subexpressions of each submatrix is determined by the EDA tool after performing logic simplification of the data bits associated with the equations (7)-(9) (as illustrated in FIGS. 3A-3C). When the PCSC 400 is implemented by mapping the set of subexpressions of each submatrix into the HVXLG 416, a number of LUTs in the HVXLG 416 is less as compared to a number of LUTs in a conventional PCSC (such as the conventional PCSC 100). Due to the reduced number of LUTs, the BCH decoder 204 that includes the PCSC 400 consumes low power and occupies less area on the FPGA 202 as compared to a conventional BCH decoder that includes the conventional PCSC 100. Further, due to the reduced area requirement, interconnect routing among LUT clusters inside the FPGA 202 is simplified as compared to the routing in FPGAs that implement the conventional BCH decoder. Thus, due to the simplified interconnect routing and the reduced area and power consumption, performance of the BCH decoder 204 is higher than the conventional BCH decoder.

Figure 5:
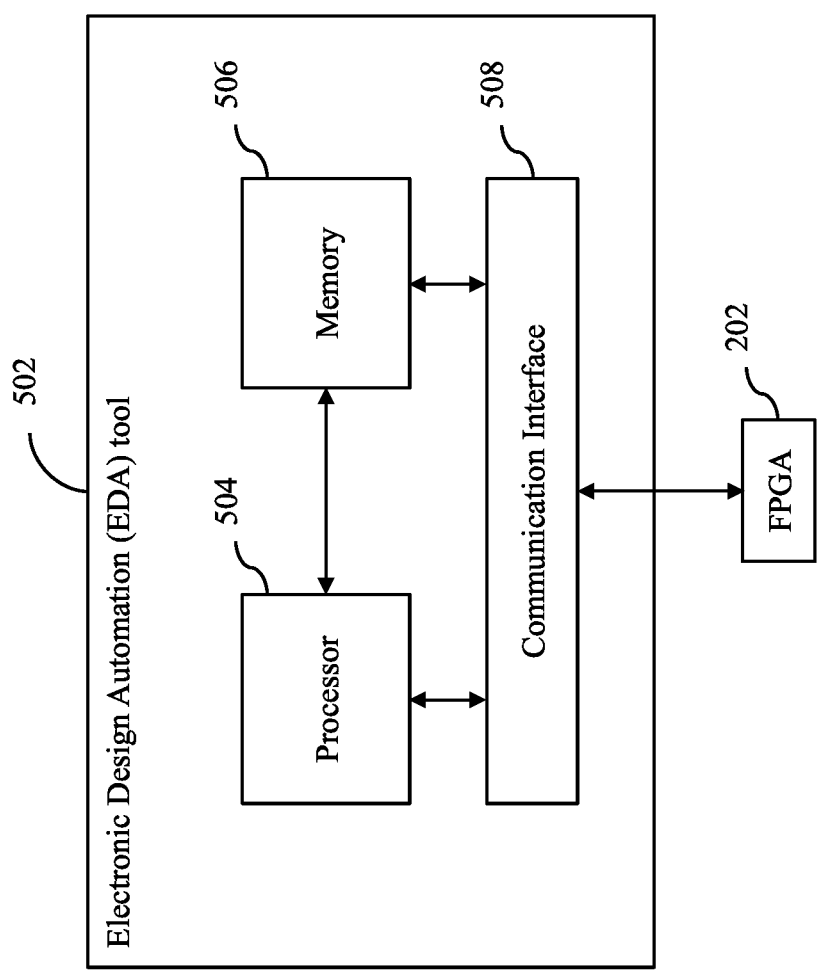
FIG. 5 illustrates a block diagram of the EDA tool in accordance with an embodiment of the present invention.

FIG. 5 illustrates a block diagram of the EDA tool (hereinafter designated as, "EDA tool 502") in accordance with an embodiment of the present invention. The EDA tool 502 includes a processor 504, a memory 506, and a communication interface 508. The processor 504 and the memory 506 may collectively constitute a computer system, for example, a stand-alone personal computer, a network of processors and memories, a mainframe system, or the like. Such computer systems are known to those of skill in the art. The processor 504 is configured to generate the binary expressions illustrated in the binary matrix 302 based on the finite field arithmetic, and store the binary expressions in the memory 506. The processor 504 is further configured to form the set of subexpressions of each submatrix as described in FIGS. 3A-3C, and map the set of subexpressions into the HVXLG 416. The processor 504 is further configured to communicate with the FPGA 202 via the communication interface 508 for mapping the set of subexpressions of each submatrix. It will be understood by a person skilled in the art that the EDA tool 502 further maps the equations (2)-(4) into the first set of LUT clusters 206, and the one or more equations associated with the KES circuit into the second set of LUT clusters 208. Although the present invention describes the EDA tool 502 as a hardware, it will be apparent to a person skilled in the art that the EDA tool 502 may be a software application that runs on a computer, without deviating from the scope of the present invention.

Figure 6A:
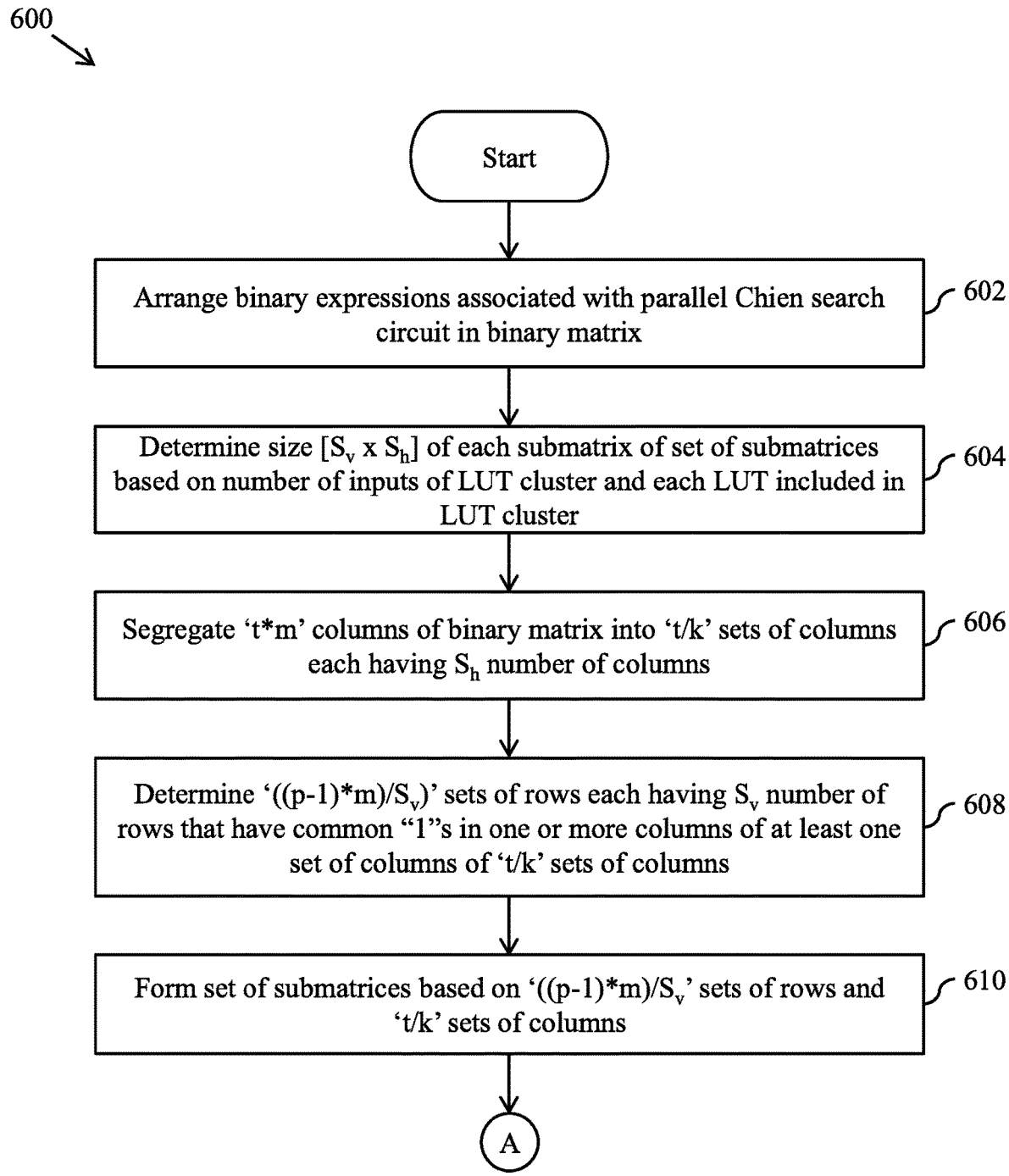
FIGS. 6A and 6B, collectively, illustrate a flow chart of a method for implementing the BCH decoder in the FPGA by using the EDA tool in accordance with an embodiment of the present invention.
Figure 6B:
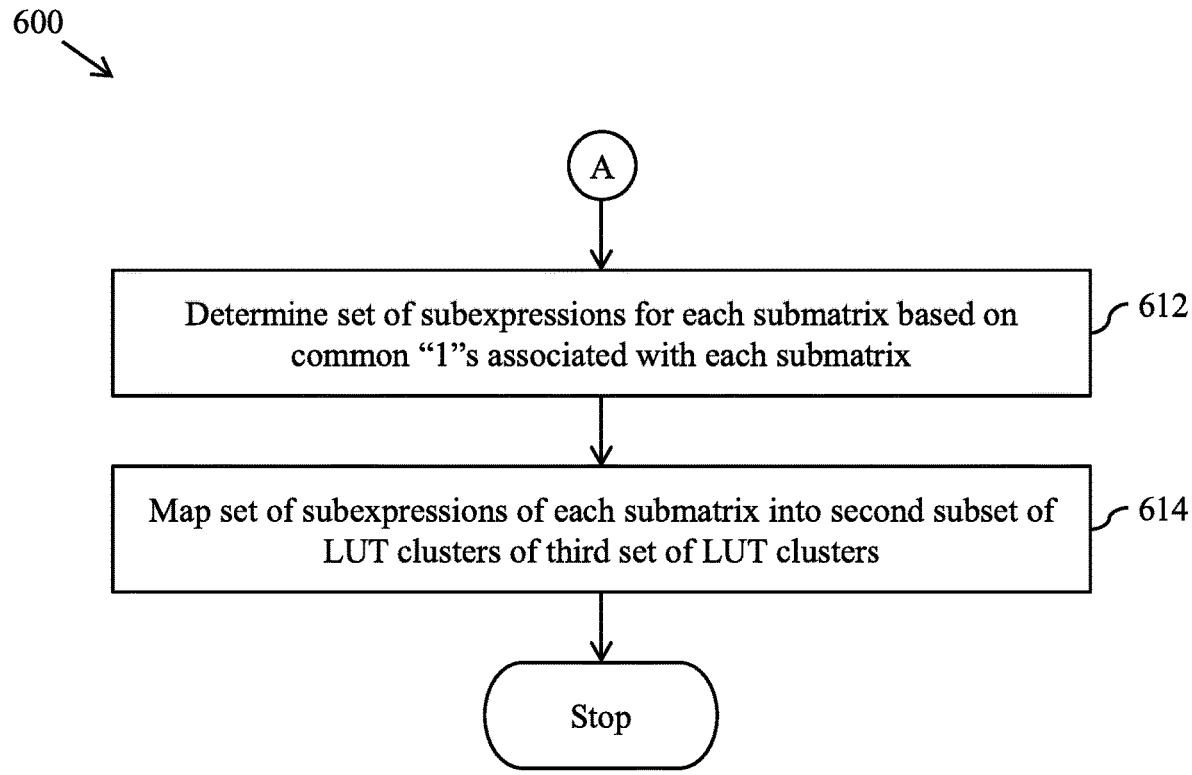

FIGS. 6A and 6B, collectively, illustrate a flow chart 600 of a method for implementing the BCH decoder 204 in the FPGA 202 by using the EDA tool 502 in accordance with an embodiment of the present invention.

Referring now to FIG. 6A, at step 602, the EDA tool 502 arranges the binary expressions associated with the PCSC 400, i.e., the equations (7)-(9), in the binary matrix 302. At step 604, the EDA tool 502 determines a size of each submatrix (i.e., $[S_v \times S_h]$) of the set of submatrices based on a number of inputs of a LUT cluster of the FPGA 202 and a number of inputs of each LUT included in the LUT cluster. At step 606, the EDA tool 502 segregates the 't*m' number of columns of the binary matrix 302 into the 't/k' sets of columns each having '$S_h$' number of columns as illustrated in FIG. 3B. At step 608, the EDA tool 502 determines the '$((p-1)*m)/S_v$' sets of rows each having '$S_v$' number of rows that have common "1"s in one or more columns of at least one set of columns of the 't/k' sets of columns. For example, the EDA tool 502 iteratively determines '$S_v$' rows associated with the first set of the rows that have maximum number of common "1"s in one or more columns of the first set of columns.

At step 610, the EDA tool 502 forms the set of submatrices based on the '$((p-1)*m)/S_v$' sets of rows and the 't/k' sets of columns. The EDA tool 502 forms the first submatrix 302a of the set of submatrices by combining together the part of the first set of rows that has maximum number of common "1"s in the one or more columns of the first set of columns.

Referring now to FIG. 6B, at step 612, the EDA tool 502 determines the set of subexpressions for each submatrix based on the common "1"s associated with each submatrix. For example, the EDA tool 502 determines the first set of subexpressions $[W_1 \ldots W_u \; O_1 \ldots O_{Sv}]$ for the first submatrix 302a. By forming the first set of subexpressions $[W_1 \ldots W_u \; O_1 \ldots O_{Sv}]$, the EDA tool 502 reduces one or more columns of the first submatrix 302a that have common "1"s. The determination of the set of subexpressions $[W_1 \ldots W_u \; O_1 \ldots O_{Sv}]$ associated with the first submatrix 302a by the EDA tool 502 is illustrated in FIG. 3C. At step 614, the EDA tool 502 maps the set of subexpressions of each submatrix into the second subset of LUT clusters (i.e., the HVXLG 416) of the third set of LUT clusters 210. The EDA tool 502 further maps the syndrome vectors (i.e., data bits associated with the equations (2)-(4)) into the first set of LUT clusters 206, and the one or more equations associated with the KES circuit into the second set of LUT clusters 208. Additionally, the EDA tool 502 maps the feedback circuit 402 into the first subset of LUT clusters of the third set of LUT clusters 210, and the equations associated with the accumulation logic circuitry into the third subset of LUT clusters of the third set of LUT clusters 210, thereby implementing the BCH decoder 204 in the FPGA 202.

Although the present invention describes implementation of a BCH decoder in an FPGA, it will be understood by those skilled in the art that the scope of the present invention is not limited to it. In various other embodiments of the present invention, various decoders, having binary expressions that are arranged in a binary matrix (such as the binary matrix 302), may be implemented in a similar manner.

It will be understood by those skilled in the art that the same logical function may be performed by different arrangements of multiplexers, multipliers, adders or that logic circuits operate using either positive or negative logic signals. Therefore, variations in the arrangement of some of the multiplexers, multipliers, adders described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A method for implementing a decoder in a field programmable gate array (FPGA) by using an electronic design automation tool, wherein the FPGA includes a plurality of look-up table (LUT) clusters, the method comprising:

arranging, in a first plurality of rows and a first plurality of columns of a binary matrix, a first plurality of expressions such that a first expression of the first plurality of expressions is arranged in a first row of the first plurality of rows, and a plurality of data bits associated with the first expression are arranged in the first plurality of columns;

forming a plurality of submatrices based on the binary matrix, wherein a first submatrix of the plurality of submatrices includes a second plurality of rows and a second plurality of columns of the first plurality of rows and the first plurality of columns, respectively, and wherein the second plurality of rows have common data bits in one or more columns of the second plurality of columns;

determining a set of subexpressions for each submatrix of the plurality of submatrices based on the common data bits associated with each submatrix; and mapping the set of subexpressions of each submatrix into one or more LUT clusters of the plurality of LUT clusters, thereby implementing the decoder in the FPGA.

2. The method of claim 1, wherein the decoder is a Bose-Chaudhuri-Hocquenghem (BCH) decoder.

3. The method of claim 2, wherein the first plurality of expressions are associated with syndrome calculation in the BCH decoder.

4. The method of claim 2, wherein the first plurality of expressions are associated with determination of one or more roots of an error locator polynomial in the BCH decoder by way of a Chien search algorithm.

5. The method of claim 1, wherein a number of columns in the second plurality of columns corresponds to a number of inputs of a LUT cluster of the plurality of LUT clusters, and a number of rows in the second plurality of rows corresponds to a number of inputs of a first LUT of the LUT cluster.

6. The method of claim 1, wherein the common data bits in the one or more columns of the second plurality of columns are binary "1"s.

7. The method of claim 1, wherein a first column of the second plurality of columns is consecutive to a second column of the second plurality of columns.

8. The method of claim 1, wherein the plurality of submatrices are mutually exclusive and collectively exhaustive of the binary matrix.

9. The method of claim 1, wherein a set of output expressions is generated based on the plurality of submatrices, and wherein errors in an input message that is received by the decoder are determined based on the set of output expressions.

10. A non-transitory computer readable medium having stored thereon, computer executable instructions, which when executed by a computer, cause the computer to execute operations for implementing a decoder in a field programmable gate array (FPGA), wherein the FPGA includes a plurality of look-up table (LUT) clusters, the operations comprising:
- arranging, in a first plurality of rows and a first plurality of columns of a binary matrix, a first plurality of expressions such that a first expression of the first plurality of expressions is arranged in a first row of the first plurality of rows, and a plurality of data bits associated with the first expression are arranged in the first plurality of columns;
- forming a plurality of submatrices based on the binary matrix, wherein a first submatrix of the plurality of submatrices includes a second plurality of rows and a second plurality of columns of the first plurality of rows and the first plurality of columns, respectively, and wherein the second plurality of rows have common data bits in one or more columns of the second plurality of columns;
- determining a set of subexpressions for each submatrix of the plurality of submatrices based on the common data bits associated with each submatrix; and
- mapping the set of subexpressions of each submatrix into one or more LUT clusters of the plurality of LUT clusters, thereby implementing the decoder in the FPGA.

11. The non-transitory computer readable medium of claim 10, wherein the decoder is a Bose-Chaudhuri-Hocquenghem (BCH) decoder.

12. The non-transitory computer readable medium of claim 11, wherein the first plurality of expressions are associated with syndrome calculation in the BCH decoder.

13. The non-transitory computer readable medium of claim 11, wherein the first plurality of expressions are associated with determination of one or more roots of an error locator polynomial in the BCH decoder by way of a Chien search algorithm.

14. The non-transitory computer readable medium of claim 10, wherein a number of columns in the second plurality of columns corresponds to a number of inputs of a LUT cluster of the plurality of LUT clusters, and a number of rows in the second plurality of rows corresponds to a number of inputs of a first LUT of the LUT cluster.

15. The non-transitory computer readable medium of claim 10, wherein the common data bits in the one or more columns of the second plurality of columns are binary "1"s.

16. The non-transitory computer readable medium of claim 10, wherein a first column of the second plurality of columns is consecutive to a second column of the second plurality of columns.

17. The non-transitory computer readable medium of claim 10, wherein the plurality of submatrices are mutually exclusive and collectively exhaustive of the binary matrix.

18. The non-transitory computer readable medium of claim 10, wherein a set of output expressions is generated based on the plurality of submatrices, and wherein errors in an input message that is received by the decoder are determined based on the set of output expressions.

19. A decoder implemented in a field programmable gate array (FPGA), the decoder comprising:
- a first plurality of look-up table (LUT) clusters, wherein one or more sets of subexpressions associated with a first plurality of expressions are mapped into the first plurality of LUT clusters, and wherein a first set of subexpressions of the one or more sets of subexpressions is determined by steps comprising:
  - arranging, in a first plurality of rows and a first plurality of columns of a binary matrix, the first plurality of expressions such that a first expression of the first plurality of expressions is arranged in a first row of the first plurality of rows, and a plurality of data bits associated with the first expression are arranged in the first plurality of columns; and
  - forming a first submatrix of a plurality of submatrices based on the binary matrix, wherein the first submatrix includes a second plurality of rows and a second plurality of columns of the first plurality of rows and the first plurality of columns, respectively, wherein the second plurality of rows have common data bits in one or more columns of the second plurality of columns, and wherein the first set of subexpressions is associated with the first submatrix, and is determined based on the common data bits.

20. The decoder of claim 19, further comprising:
- a second plurality of LUT clusters, wherein a second plurality of expressions associated with an accumulation logic circuitry are mapped into the second plurality of LUT clusters, wherein the accumulation logic circuitry determines a set of output expressions based on the one or more sets of subexpressions, and wherein errors in an input message that is received by the decoder are determined based on the set of output expressions.

* * * * *